United States Patent [19]
Kanno et al.

[11] Patent Number: 5,458,967
[45] Date of Patent: Oct. 17, 1995

[54] COMPOSITE SHEET FOR ELECROMAGNETIC WAVE SHIELD

[75] Inventors: Toshiaki Kanno; Makoto Katsumata; Hidenori Yamanashi; Hitoshi Ushijima, all of Shizuoka, Japan

[73] Assignee: Yazaki Corporation, Tokyo, Japan

[21] Appl. No.: 165,528

[22] Filed: Dec. 13, 1993

Related U.S. Application Data

[63] Continuation of Ser. No. 5,385, Jan. 15, 1993, abandoned.

[30] Foreign Application Priority Data

Jan. 27, 1992 [JP] Japan .................................. 4-012038

[51] Int. Cl.$^6$ .................................. C09J 7/02; C09J 9/02
[52] U.S. Cl. ........................... 428/344; 428/349; 428/355; 428/356
[58] Field of Search .......................... 174/35 R, 35 GC, 174/35 MS; 428/344, 355, 458, 461, 349, 356

[56] References Cited

U.S. PATENT DOCUMENTS

| | | | |
|---|---|---|---|
| 4,379,098 | 4/1983 | Gumienny | 174/35 MS |
| 4,554,204 | 11/1985 | Ono et al. | 428/246 |
| 4,678,699 | 7/1987 | Kritchevsky et al. | 428/175 |
| 4,749,625 | 6/1988 | Obayashi et al. | 428/461 X |
| 4,784,899 | 11/1988 | Ono et al. | 428/286 X |
| 4,973,514 | 11/1990 | Gamble et al. | 428/297 |
| 4,980,223 | 12/1990 | Nakano et al. | |
| 5,045,635 | 9/1991 | Kaplo et al. | 174/35 GC |
| 5,089,326 | 2/1992 | Bonazza | 428/286 X |
| 5,105,056 | 4/1992 | Hoge, Jr. et al. | 174/35 GC |
| 5,115,104 | 5/1992 | Bunyan | 174/35 GC |
| 5,142,101 | 8/1992 | Matsuzaki et al. | 174/35 GC |
| 5,239,125 | 8/1993 | Savage et al. | 174/35 R X |
| 5,304,750 | 4/1994 | Schubert et al. | 174/35 MS X |

FOREIGN PATENT DOCUMENTS

| | | |
|---|---|---|
| 973052 | 11/1959 | Germany . |
| 2415643 | 10/1975 | Germany . |
| 3444986 | 6/1985 | Germany . |
| 4104038 | 8/1991 | Germany . |
| 62-263043 | 11/1987 | Japan . |
| 2240782A | 8/1991 | United Kingdom . |

OTHER PUBLICATIONS

Abstract of GB 2,240,782A and DE 4,104,038A Aug. 14, 1991.
German Office Action, dated May 25, 1993.
English translation of German Office Action, dated May 25, 1993.
Rompp Chemie Lexikon, Falbe, Regitz, 9. Auflage, Bd. 3, 1990, S. 1755 und 1756.

*Primary Examiner*—Jenna L. Davis
*Attorney, Agent, or Firm*—Finnegan, Henderson, Farabow, Garrett & Dunner

[57] ABSTRACT

A composite sheet for electromagnetic wave shield is light and excellent in laying operability and in magnetic field shielding property. The composite sheet for electromagnetic wave shield comprises a metal foil and a conductive hot melt resin layer laminated on each other. It is specifically desired that the conductive hot melt resin layer is made of a material in which vapor phase growth carbon fibers of diameters of not more than 1.0 μm and lengths of not more than 50 μm are dispersed in a hot melt resin. The conductive hot melt resin layer may be preferably provided at least on a part of one side of the metal foil.

10 Claims, 3 Drawing Sheets

COMPOSITE SHEET FOR ELECROMAGNETIC WAVE SHIELD

This application is a continuation of application Ser. No. 08/005,385, filed Jan. 15, 1993, now abandoned.

BACKGROUND OF THE INVENTION

1. Field of the Invention

The present invention relates to a sheet material used for magnetic wave shield, and more particularly to a composite sheet excellent in electromagnetic wave shielding effect.

2. Description of the Related Background Art

As electronic devices such as computers, office automation instruments, and the like become popular nowadays, there are many chances for electromagnetic waves generated by such devices to cause an error operation in such an electronic device. There have been various methods studied to protect the electronic devices from the electromagnetic interference, for example a method to form walls and floors in housing or room with an electromagnetic wave shielding material, a method to stick a sheet for electromagnetic wave shield to walls and floors, or a method to cover wiring inside a room or a car with a metal foil.

Many materials are proposed as such a sheet material for electromagnetic wave shield, for example, metal foils, carbon fiber sheets or carbon fiber fabrics, and synthetic resin films in which powders or fibers of a conductive material such as metal oxides, metals, or conductive carbons, and so on are intermixed. It may be also known that an adhesive layer is continuously or intermittently given on one side of such a sheet material for electromagnetic wave shield to form a wall covering or to form a decorative laminate using the wall covering.

Among such sheet materials for electromagnetic wave shield, a sheet in which a thermoplastic synthetic resin layer, acting as the adhesive layer, such as a polyester film is provided on a back surface of a metal foil such as an aluminum foil is relatively light in weight and easy in processing, and therefore becomes often used in constructing a shield room or in shielding an electronic device. However, since the synthetic resin layer of the sheet is non-conductive, secondary treatments are necessary to connect between two sheets in laying with a conductive coating or a conductive adhesive and further to earth the sheets in order to obtain a satisfactory electromagnetic wave shielding property. Further, the sheet also has a problem of ineffectiveness to magnetic field shield, though it is effective to static charge prevention and electric field shield.

SUMMARY OF THE INVENTION

It is, therefore, an object of the present invention to provide a composite sheet for electromagnetic wave shield light in weight and excellent in laying operability while having a further excellent magnetic field shielding property.

The object of the present invention can be achieved by a composite sheet for electromagnetic wave shield comprising a metal foil and a conductive hot melt resin layer laminated on each other which acts as an adhesive.

The metal foil for the composite sheet for electromagnetic wave shield according to the present invention is preferably an aluminum foil. The conductive hot melt resin layer may be provided at least on a part of one side of the metal foil.

A base material of the conductive hot melt resin is a hot melt resin selected for example from polyolefins, ethylene-vinyl acetate copolymer resins (as will be referred to as EVA), diene-styrene copolymer resins, and the like. Additives such as a tackifier, a plasticizer, an antiaging agent, and the like may be added as desired. Vapor phase growth carbon fibers desirably with diameters of not more than 1.0 μm and lengths of not more than 50 μm, preferably 10 to 200 parts by weight thereof, are dispersedly formulated in the hot melt resin.

The vapor phase growth carbon fibers (VGCF) providing the conductivity when formulated in the hot melt resin may be obtained as follows. A raw material is a hydrocarbon compound selected from aromatic hydrocarbons such as toluene benzene naphthalene, and so on, and aliphatic hydrocarbons such as ethane, ethylene, and so on, preferably, benzene or naphthalene. The raw material is gasified and is then subject to the catalytic cracking at 900° to 1500° C. in contact with a catalyst made of an ultra fine metal with a carrier gas for example of hydrogen. An example of the catalyst is a material in which grains of iron, nickel, or iron-nickel. alloy with grain sizes of 100 to 300 angstroms are coated on a substrate made of a ceramic or a graphite. An alternative method to make the VGCF is as follows. The raw material as listed above is gasified and is subject to the catalytic cracking in contact with a catalyst made of an ultra fine metal, for example grains of iron, nickel, or iron-nickel alloy with grain sizes of 100 to 300 angstroms, which are dispersedly floating in a reaction zone kept at 900° to 1500° C. with a carrier gas for example of hydrogen.

The thus-obtained carbon fibers normally have diameters of not more than 1.0 μm and lengths of not more than 50 μm. The carbon fibers may be ground as desired using a proper grinder such as a ball mill, a rotor speed mill, a cutting mill, and the like. The lengths of not more than 50 μm are effective to enhance the dispersibility and the conductivity in formulation with the hot melt resin.

Further, the thus-obtained carbon fibers are preferably subject to a heat treatment under an atmosphere of an inert gas such as argon at a temperature of 1500° to 3500° C., preferably at 2500° to 300° C., for 3 to 120 minutes, preferably for 30 to 60 minutes, so that the carbon fibers are turned to graphite fibers having a three-dimensional crystal structure in which a graphite-like structure (carbon hexagonal network) is oriented substantially in parallel with the fiber axis like annual rings. The thus-obtained graphite fibers may be reacted with a substance selected from acids such as nitric acid, halogens such as chlorine, bromine, and fluorine, alkaline metals such as sodium, potassium and the like, metal salts such as ferric chloride and manganese chloride, and metal fluoride compounds such as titanium fluoride and vanadium fluoride, to obtain graphite interlaminar compound fibers. Such graphite interlaminar compound fibers are also effective as the carbon fibers of the present invention.

In the present invention, the conductive hot melt resin may be obtained by formulating the vapor phase growth carbon fibers in the hot melt resin with a solvent and additives, using a kneading machine in popular use, for example, a twin roll mill, a kneader, an intermix, a Banburry mixer.

There is no restrictions on the lamination method of the thus-obtained conductive hot melt resin on a surface of the metal foil, but the lamination can be made by a method to coat the resin solved in a solvent on the metal foil, or, by a method to carry out the contact bonding or the fusing after the resin is formed in a sheet and the sheet is set on the metal foil surface. The lamination of the resin is preferably effected on the entire plane or on a part of one side of the metal foil.

The composite sheet for electromagnetic wave shield according to the present invention is remarkably easy in laying operation, and has an excellent electromagnetic wave shielding property, specifically, a good magnetic field shielding effect.

The composite sheet for electromagnetic wave shield according to the present invention is thin and light to have a flexibility while being excellent in laying operability on an apparatus, wiring, or a construction requiring the electromagnetic wave shield. The composite sheet has an extremely high assembling efficiency. The composite sheet also has a specific advantage to provide an excellent magnetic field shielding property, which could not have been attained in the conventional light shielding materials, as well as the electric field shielding property.

The structure, operation and advantages of the present invention will become further apparent upon consideration of the following description, taken in conjunction with the accompanying drawings.

DETAILED DESCRIPTION OF THE PREFERRED EMBODIMENTS

EXAMPLE 1

Figure 1:
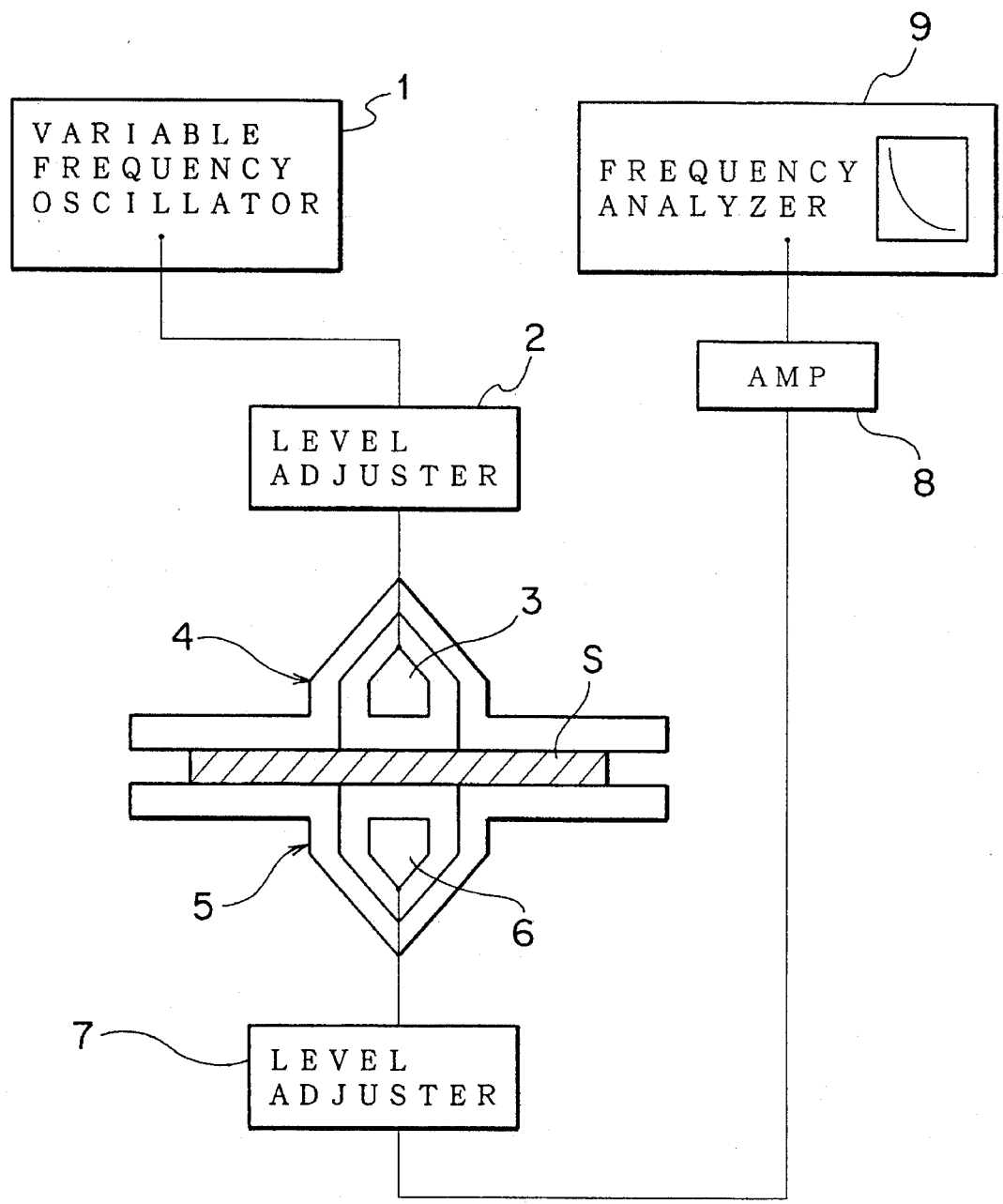
FIG. 1 is a constitutional drawing to show an apparatus for measuring a shielding effect of near electric field.

Grains of metal iron catalyst with grain sizes of 100 to 300 angstroms were made floating in an upward stream of hydrogen in a vertical tubular electric oven adjusted at a temperature of 1000° to 1100° C. Then a mixture gas of benzene and hydrogen was introduced from the bottom for catalytic cracking to obtain carbon fibers with lengths of 1 to 300 μm and diameters of 0.01 to 0.5 μm. Then, the carbon fibers were ground at a rotation number of 500 rpm for twenty minutes using a planetary ball mill (P-5 Type, Friche Japan). The ground carbon fibers were put in an electric oven to be graphitized at 2960° to 3000° C. under an atmosphere of argon for thirty minutes. The thus-obtained graphitized vapor phase growth carbon fibers had diameters of not more than 0.5 μm and lengths of 1–50 μm.

The above-graphitized vapor phase growth carbon fibers were put into an EVA (EV 250 manufactured by DuPont-MITUI Polychemicals Co., LTD) in a formulation of 60% by weight of the carbon fibers. The mixture was kneaded at 140° to 150° C. for twenty minutes using a 6 inch roll. Then the kneaded mixture was pressed at 170° C. to obtain a resin composition sheet of 70 mm×10 mm×2 mm. An electric resistance of the obtained sheet was measured. A volume resistivity measured was 0.2 Ωcm.

Then, this sheet was placed on one side of an aluminum foil with a thickness of 15 μm. They were pressed at 170° C. to obtain a composite sheet A according to the present invention in which a conductive hot melt resin layer of thickness of 100 μm was laminated.

EXAMPLE 2

The same graphitized vapor phase growth carbon fibers as used in Example 1 were put into the EVA in a formulation of 50% by weight of the carbon fibers, and the mixture was solved in a toluene to produce a coating fluid with a 20% of solid matters. The coating fluid was coated on a surface of the same aluminum foil as in Example 1, and was heated to dry then to obtain a coat of thickness of about 32 μm. The aluminum foil with the coat was pressed at 170° C. to obtain a composite sheet B according to the present invention in which a conductive hot melt resin layer of thickness of 30 μm was laminated.

COMPARATIVE EXAMPLE 1

A sheet was made of the EVA without using the graphitized vapor phase growth carbon fibers. A composite sheet a in which a hot melt resin layer of thickness of 75 μm was laminated was obtained as a comparative example in the same manner as in Example 1.

COMPARATIVE EXAMPLE 2

A sheet of resin composition was made in the same manner as in Example 1 except that PAN type carbon fibers (Torayca T 300 ground, MLD 300 manufactured by Toray Industries, Inc.) were substituted for the graphitized vapor phase growth carbon fibers. The thus-obtained sheet had a volume resistivity of 0.8 Ωcm. A composite sheet b was obtained as another comparative example in the same manner as in Example 1 in which a conductive hot melt resin layer of thickness of 100 μm was laminated.

COMPARATIVE EXAMPLE 3

A sheet of resin composition was made in the same manner as in Example 1 except that conductive carbon black (Ketchenblack EC manufactured by Lion-Akzo) was substituted for the graphitized vapor phase growth carbon fibers in a formulation of 40% by weight of carbon black in the EVA. The sheet had a volume resistivity of 0.2 Ωcm. Then, a composite sheet c was obtained as still another comparative example in the same manner as in Example 1 in which a conductive hot melt resin layer of thickness of 100 μm was laminated.

TESTS

Figure 2:
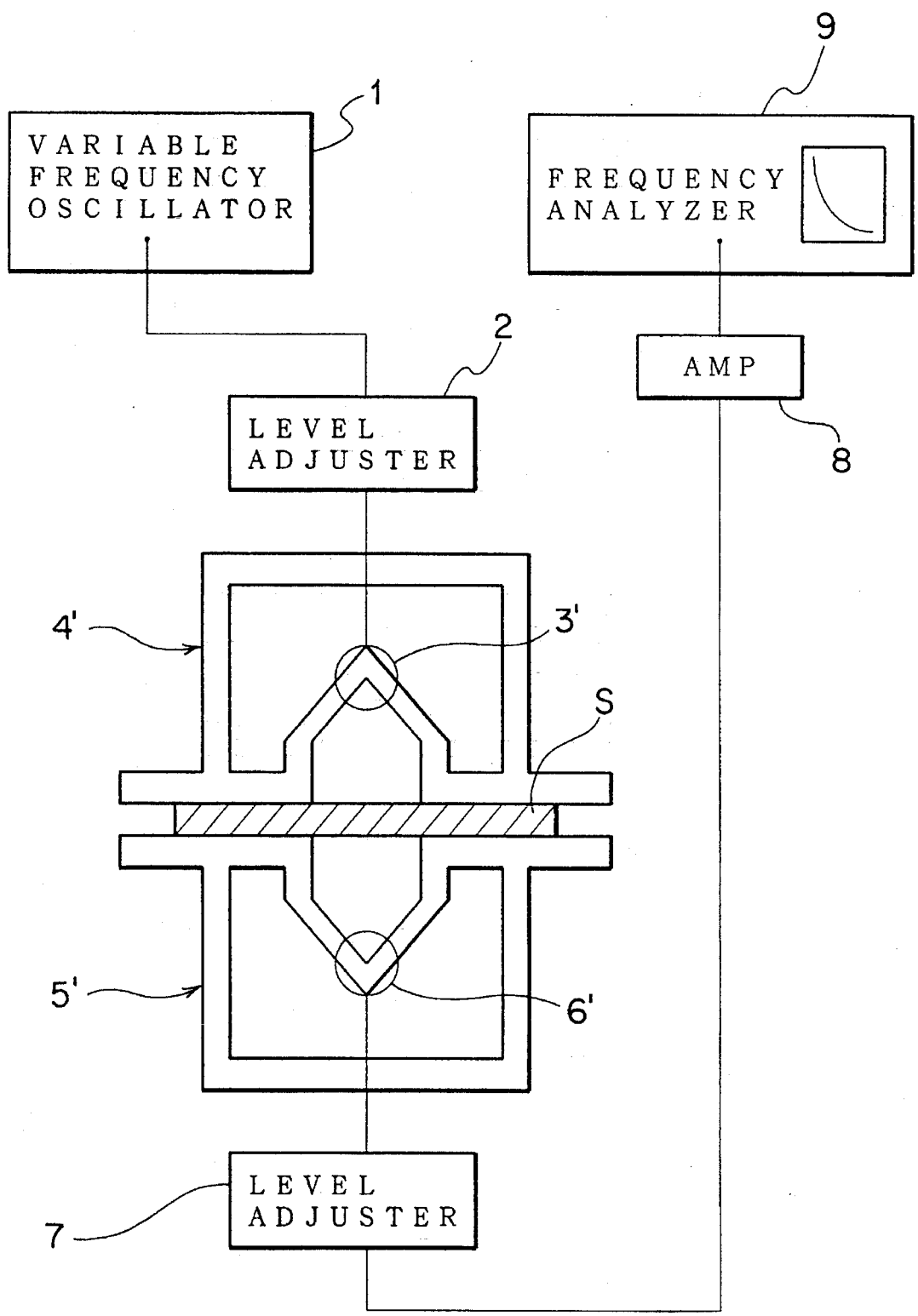
FIG. 2 is a constitutional drawing to show an apparatus for measuring a shielding effect of near magnetic field.

Shielding effects of near electric field (NE) and near magnetic field (NM) were measured using the electromagnetic wave shielding effect measuring apparatuses as shown in FIG. 1 and FIG. 2 in the KEC method (a method proposed by Incorporation of Kansai Electronic Industries Promotion Center). In the apparatus as shown in FIG. 1, reference numeral 1 designates a variable frequency oscillator, 2 and 7 level adjusters, 3 an originating antenna for electric field, 4 and 5 shield boxes for electric field, 6 a receiving antenna for electric field, 8 an amplifier, and 9 a frequency analyzer. In FIG. 2, reference numeral 3' denotes an originating antenna for magnetic field, 4' and 5' shield boxes for magnetic field, 6' a receiving antenna for magnetic field, and others are same as in FIG. 1.

Figure 3:
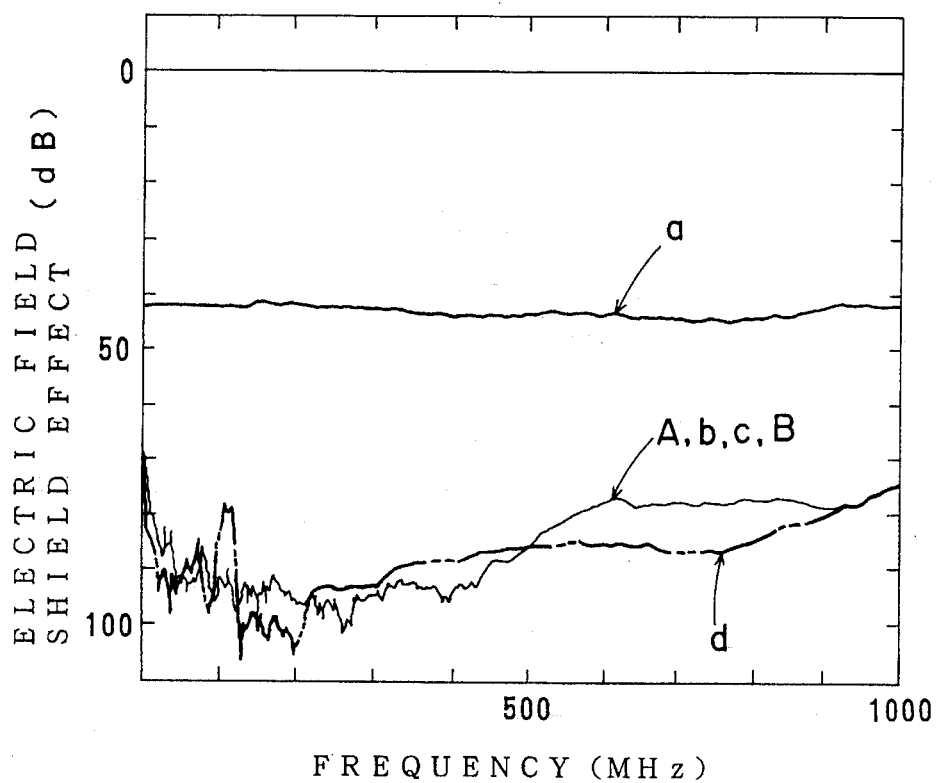
FIG. 3 is a graphic representation to show shielding effects of near electric field in a composite sheet for electromagnetic wave shield according to the present invention and in shielding sheets of comparative examples.

A sheet sample S for shielding was chosen from the composite sheets A, a, b, and c obtained in the above examples and the comparative examples, and an aluminum foil d of thickness of 15 μm as a reference. The sheet sample S was sandwiched between the shield boxes for electric field 4 and 5. An electric field signal originated from the originating antenna for electric field 3 was received by the receiving antenna for electric field 6, and was analyzed by the frequency analyzer 9. FIG. 3 is a graphic representation to show frequency characteristics of electric field shielding effects obtained in the frequency analyzer 9.

Figure 4:
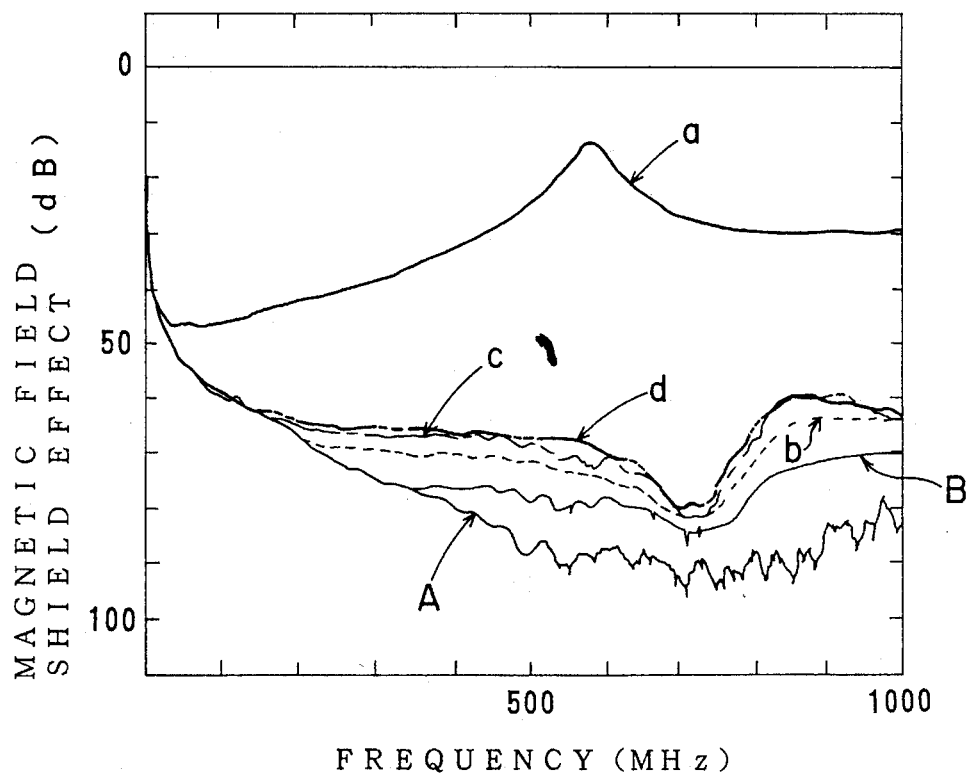
FIG. 4 is a graphic representation to show shielding effects of near magnetic field in a composite sheet for electromagnetic wave shield according to the present invention and in shielding sheets of comparative examples.

The same sheet sample S for shielding was sandwiched between the shield boxes for magnetic field 4' and 5' to measure the magnetic field shielding effect thereof. FIG. 4 is a graphic representation to show frequency characteristics of magnetic field shielding effects obtained similarly as above.

The following Table shows evaluation results at a frequency of 500 Mhz with the near electric field shielding effects (NE) and the near magnetic field shielding effects (NM) of the respective samples from the graphic representations as shown in FIG. 3 and FIG. 4. It is seen from the results that the composite sheet for electromagnetic wave shield according to the present invention is excellent not only in near electric field shielding effect but also in near magnetic field shielding effect, as compared to the shielding sheets of the comparative examples.

TABLE

| Sample | Shielding Effect (dB) | |
|---|---|---|
| | NE | NM |
| A | 86.6 | 87.2 |
| a | 43.5 | 24.1 |
| b | 85.8 | 70.1 |
| c | 86.0 | 67.4 |
| d | 85.4 | 67.0 |
| B | 86.1 | 75.0 |

While the invention has been described with reference to the preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

What is claimed is:

1. A composite sheet for an electromagnetic wave shield comprising:

a metal foil; and a conductive hot melt adhesive laminated to said metal foil, said conductive hot melt adhesive containing vapor phase growth carbon fibers of not more than 50 μm in length and diameters of not more than 1.0 μm.

2. A composite sheet according to claim 1, wherein said metal foil is made of aluminum.

3. A composite sheet according to claim 1, wherein said conductive hot melt adhesive comprises an ethylene vinyl acetate copolymer resin.

4. A composite sheet according to claim 1, wherein, 10 to 200 parts by weight of said vapor phase growth carbon fibers are dispersed in said conductive hot melt adhesive for one hundred parts by weight of said conductive hot melt adhesive.

5. A composite sheet according to claim 2, wherein, 10 to 200 parts by weight of said vapor phase growth carbon fibers are dispersed in said conductive hot melt adhesive for one hundred parts by weight of said conductive hot melt adhesive.

6. A composite sheet according to claim 3, wherein, 10 to 200 parts by weight of said vapor phase growth carbon fibers are dispersed in said conductive hot melt adhesive for one hundred parts by weight of said conductive hot melt adhesive.

7. A composite sheet according to claim 1, wherein said vapor phase growth carbon fibers have diameters of not more than 0.5 μm and length of 1–50 μm.

8. A composite sheet according to claim 1, wherein said vapor phase growth fibers are graphitized.

9. A composite sheet according to claim 1, wherein said conductive hot melt adhesive has a thickness of 30 to 100 μm.

10. A composite sheet according to claim 9, wherein said conductive hot metal adhesive comprises an ethylene vinyl acetate resin.

* * * * *